(12) United States Patent
Sano et al.

(10) Patent No.: US 7,629,740 B2
(45) Date of Patent: Dec. 8, 2009

(54) DISPLAY DEVICE WITH STACKED LAYER BODY

(75) Inventors: Hiroshi Sano, Hakusan (JP); Shirou Sumita, Ishikawa-gun (JP); Tatsuo Yoshioka, Toyooka (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 415 days.

(21) Appl. No.: 11/114,028

(22) Filed: Apr. 26, 2005

(65) Prior Publication Data

US 2005/0242720 A1     Nov. 3, 2005

(30) Foreign Application Priority Data

Apr. 30, 2004  (JP) ................ 2004-136765

(51) Int. Cl.
    *H01J 33/04*     (2006.01)
(52) U.S. Cl. ........................ 313/506; 313/509
(58) Field of Classification Search .......... 313/500–512
    See application file for complete search history.

(56) References Cited

U.S. PATENT DOCUMENTS

| | | | |
|---|---|---|---|
| 6,664,137 B2 | 12/2003 | Weaver | |
| 6,891,330 B2 * | 5/2005 | Duggal et al. | 313/511 |
| 6,909,232 B2 * | 6/2005 | Nakayama et al. | 313/504 |
| 7,071,613 B2 * | 7/2006 | Kim et al. | 313/504 |
| 2003/0044639 A1 * | 3/2003 | Fukuda | 428/690 |
| 2003/0062527 A1 * | 4/2003 | Kumar et al. | 257/79 |
| 2003/0184219 A1 | 10/2003 | Duggal et al. | |
| 2003/0201716 A1 * | 10/2003 | Yamazaki et al. | 313/506 |

FOREIGN PATENT DOCUMENTS

| | | |
|---|---|---|
| JP | 2000-294369 | 10/2000 |
| JP | 2002-14343 | 1/2002 |
| JP | 2003-217829 | 7/2003 |
| TW | 525199 | 3/2003 |

* cited by examiner

*Primary Examiner*—Nimeshkumar D. Patel
*Assistant Examiner*—Anne M Hines
(74) *Attorney, Agent, or Firm*—Oblon, Spivak, McClelland, Maier & Neustadt, L.L.P.

(57) ABSTRACT

A display device includes a substrate having, on a major surface thereof, a display area including a plurality of pixels for displaying an image, and a stacked layer body that is formed by stacking a first thin film, which is disposed to cover the display area, a second thin film, which partly covers the first thin film, and a third thin film, which covers the second thin film and is formed with a larger pattern than the first thin film. The third thin film contacts a peripheral part of the first thin film and covers the first thin film.

8 Claims, 5 Drawing Sheets

DISPLAY DEVICE WITH STACKED LAYER BODY

CROSS-REFERENCE TO RELATED APPLICATIONS

This application is based upon and claims the benefit of priority from prior Japanese Patent Application No. 2004-136765, filed Apr. 30, 2004, the entire contents of which are incorporated herein by reference.

BACKGROUND OF THE INVENTION

1. Field of the Invention

The present invention relates generally to a display device, and more particularly to a display device comprising a plurality of self-luminous elements.

2. Description of the Related Art

In recent years, organic electroluminescence (EL) display devices have attracted special attention. Since the organic EL display device is a display device including self-luminous elements, it has such features as a wide viewing angle, small thickness without a need for backlight, low power consumption, and a high responsivity speed.

For these features, the organic EL display device is a promising candidate for the next-generation plat-panel display device, which will take the place of liquid crystal display devices. The organic EL display device includes an array substrate. The array substrate is configured such that a plurality of organic EL elements are arranged in a matrix as self-luminous elements. Each organic EL element has such a structure that an organic active layer with a light-emitting function is sandwiched between an anode and a cathode.

If the organic EL element comes in contact with moisture or oxygen in outside air, its light-emission characteristics would deteriorate very quickly. To avoid this, various techniques have been proposed to shield the major surface of an array substrate, on which organic EL elements are disposed, from outside air, thus sealing this major surface. As an example of such techniques, a sealing technique has been disclosed, wherein an organic film and an inorganic film are stacked on an electrode that is disposed on the top surface side of the organic EL element (see, e.g. Yuji Yanagi, "For Realization of Mass-Production of Thin, Large, Flexible Substrates", Flat Panel Display 2003, NIKKEI BP, Dec. 27, 2002, pp. 264-270). As another example, a sealing technique has been disclosed, wherein a plurality of barrier layers of inorganic material are stacked and an upper barrier layer covers an underlying barrier layer (see Jpn. Pat. Appln. KOKAI Publication No. 2003-217829).

When the above-described techniques are used, it is important to effectively suppress infiltration of moisture or oxygen from an end face of a protection layer that seals an organic EL element.

BRIEF SUMMARY OF THE INVENTION

The present invention has been made in consideration of the above-described problem, and the object of the invention is to provide a display device capable of maintaining a good display performance for a long time.

According to an aspect of the present invention, there is provided a display device comprising: a substrate having, on a major surface thereof, a display area including a plurality of pixels for displaying an image; and a stacked layer body that is formed by stacking a first thin film, which is disposed to cover the display area, a second thin film, which partly covers the first thin film, and a third thin film, which covers the second thin film and is formed with a larger pattern than the first thin film, wherein the third thin film contacts a peripheral part of the first thin film and covers the first thin film.

The present invention can provide a display device capable of maintaining a good display performance for a long time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A display device according to an embodiment of the present invention will now be described with reference to the accompanying drawings. In this embodiment, a self-luminous display device, such as an organic EL (electroluminescence) display device, is described, by way of example, as the display device.

Figure 1:
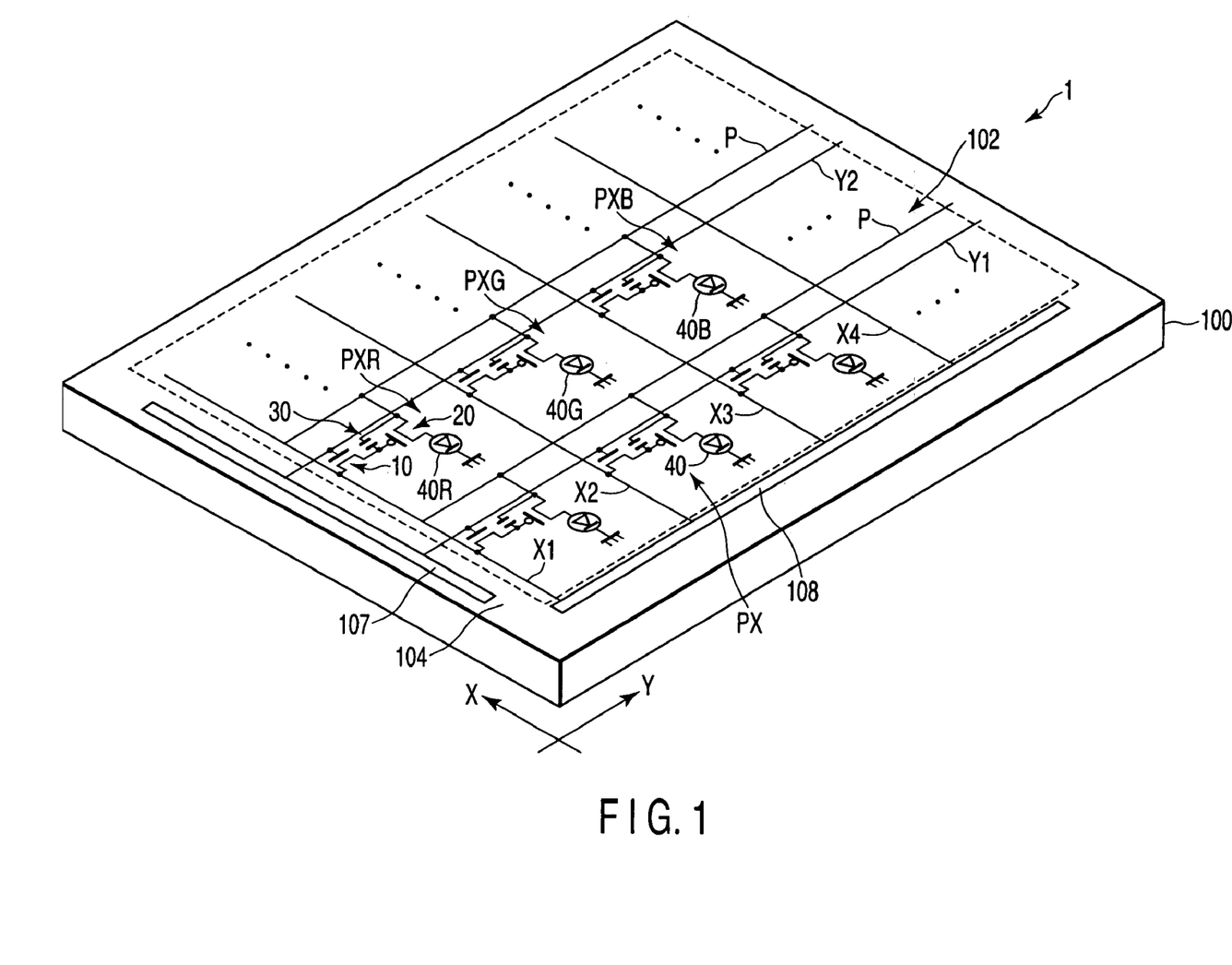
FIG. 1 schematically shows the structure of an organic EL display device according to an embodiment of the present invention.
Figure 2:
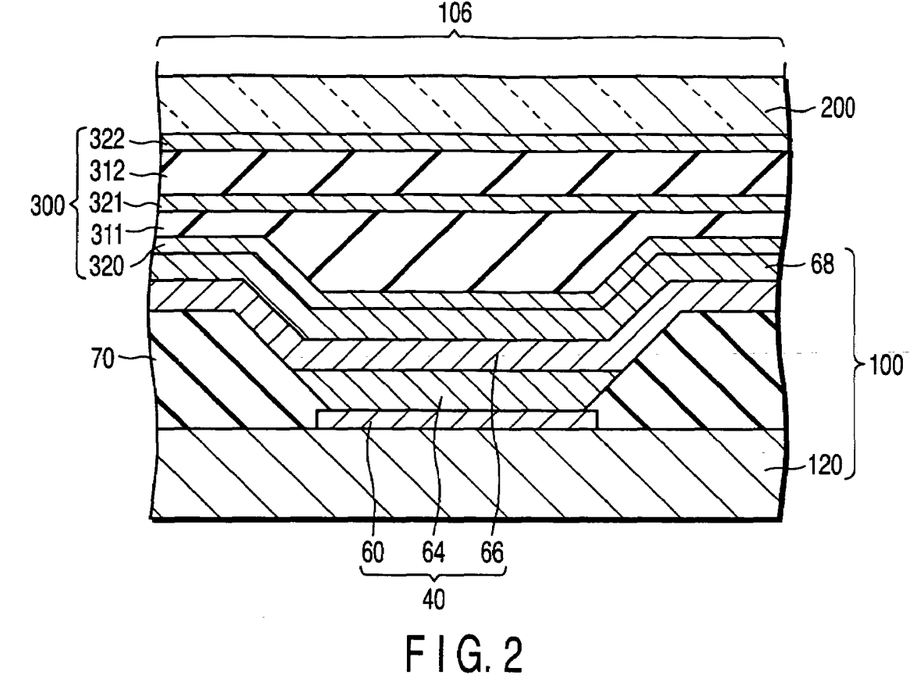
FIG. 2 is a cross-sectional view that schematically shows the structure of a 1-pixel part of the organic EL display device shown in FIG. 1.

As is shown in FIG. 1 and FIG. 2, an organic EL display device 1 is configured to have, on its major surface, an array substrate 100 having a display area 102 for displaying an image, and a sealing body 300 that seals at least the display area 102 of the array substrate 100. The display area 102 of the array substrate 100 comprises a plurality of pixels PX (R, G, B) that are arranged in a matrix.

Each of the pixels PX (R, G, B) includes a pixel switch 10 with a function of electrically separating an on-state pixel and an off-state pixel and retaining a video signal to the on-state pixel; a driving transistor 20 that supplies a desired driving current to an associated display element on the basis of the video signal that is supplied via the pixel switch 10; and a storage capacitance element 30 that stores a gate-source potential of the driving transistor 20 for a predetermined time period. Each of the pixel switch 10 and driving transistor 20 is composed of, e.g. a thin-film transistor, and includes a semiconductor layer, which is formed of polysilicon, in this embodiment.

Each of the pixels PX (R, G, B) includes an organic EL element 40 (R, G, B) functioning as a display element. Specifically, the red pixel PXR includes an organic EL element 40R that emits red light. The green pixel PXG includes an organic EL element 40G that emits green light. The blue pixel PXB includes an organic EL element 40B that emits blue light.

The respective organic EL elements 40 (R, G, B) have basically the same structure. The organic EL element 40 comprises an associated one of first electrodes 60 that are formed in an insular shape in the respective pixels PX and are arranged in a matrix; a second electrode 66 that is formed commonly to all the pixels PX so as to be opposed to the first electrodes 60; and an organic active layer 64 that functions as an optical active layer interposed between the first electrodes 60 and the second electrode 66.

The array substrate 100 includes a plurality of scan lines Ym (m=1, 2, ...) that are arranged in a row direction (i.e. Y-direction in FIG. 1) of pixels PX, a plurality of signal lines Xn (n=1, 2, ...) that are arranged in a direction (i.e. X-direction in FIG. 1) that crosses the scan lines Ym substantially at right angles, and power supply lines P for supplying power to the first electrodes 60 of the organic EL elements 40.

The power supply lines P are connected to a first electrode power supply line (not shown) that is disposed on the periphery of the display area 102. The second electrode 66 of the organic EL element 40 is connected to a second electrode power supply line (not shown) that is disposed on the periphery of the display area 102 and supplies a common potential (a ground potential in this example).

The array substrate 100 further includes at least a part of a scan line drive circuit 107, which supplies scan signals to the scan lines Ym, and at least a part of a signal line drive circuit 108, which supplies video signals to the signal lines Xn, in a peripheral area 104 that is provided around the outer periphery of the display area 102. All scan lines Ym are connected to the scan line drive circuit 107. All signal lines Xn are connected to the signal line drive circuit 108.

The pixel switches 10 are disposed near intersections between the scan lines Ym and signal lines Xn. The pixel switch 10 has a gate electrode connected to the scan line Ym, a source electrode connected to the signal line Xn, and a drain electrode connected to one of electrodes of the storage capacitance element 30 and to a gate electrode of the driving transistor 20. The driving transistor 20 has a source electrode connected to the other of the electrodes of the storage capacitance element 30 and to the power supply line P, and a drain electrode connected to the first electrode 60 of the organic EL element 40.

The array substrate 100, as shown in FIG. 2, includes a display element, that is, the organic EL element 40, which is disposed on a wiring substrate 120. The wiring substrate 120 is configured such that the pixel switch 10, driving transistor 20, storage capacitance element 30, scan line drive circuit 107, signal line drive circuit 108 and various lines (e.g. scan lines, signal lines and power supply lines) are provided on an insulating support substrate such as a glass substrate or a plastic sheet.

The first electrode 60 that is a structural component of the organic EL element 40 is disposed on the wiring substrate 120. The first electrode 60 functions as an anode and is formed of a light-transmissive electrically conductive material such as ITO (indium tin oxide) or IZO (indium zinc oxide).

The organic active layer 64 includes at least an organic compound with a light-emitting function. The organic active layer 64 may include a layer other than a light-emitting layer. For example, the organic active layer 64 may be constructed of a multi-layer structure that includes a hole buffer layer and an electron buffer layer, which are formed commonly to all color pixels, and an organic light-emitting layer, which is formed for each of the color pixels. Alternatively, the organic active layer 64 may be constructed of two layers or a single layer in which functions of various layers including a light-emitting layer are integrated. The hole buffer layer includes a hole injection layer and a hole transport layer and is interposed between the anode and the organic light-emitting layer. The hole buffer layer is formed of a thin film of, e.g. an aromatic amine derivative, a polythiophene derivative or a polyaniline derivative. The light-emitting layer is formed of an organic compound with a function of emitting red, green or blue light. When a high-polymer light emitting material is used, the light-emitting layer is formed of PPV (polyparaphenylenevinylene), or a polyfluorene derivative or a precursor thereof. In the organic active layer 64, it is necessary that only the light-emitting layer be formed of an organic material. The layers other than the light-emitting layer may be formed of either an inorganic material or an organic material.

The electron buffer layer includes an electron injection layer and an electron transport layer. The electron buffer layer is interposed between the cathode and the organic light-emitting layer and is formed of a thin film of, e.g. LiF (lithium fluoride) or Alq$_3$.

The second electrode 66 is disposed on the organic active layer 64 commonly to all the organic EL elements 40. The second electrode 66 is formed of a metallic film with an electron injection function such as Ca (calcium), Al (aluminum), Ba (barium), Ag (silver) or Yb (ytterbium), and functions as a cathode. The second electrode 66 may be a two-layer structure in which the surface of a metal film functioning as a cathode is coated with a cover metal. The cover metal is formed of, e.g. aluminum.

It is preferable that the surface of the second electrode 66 be coated with a material having moisture-absorbing characteristics as a desiccating agent. If the organic EL element 40 comes in contact with moisture, its light-emission characteristics would deteriorate very quickly. Thus, in order to protect the organic EL element 40 from moisture, a desiccating agent 68 is disposed on the second electrode 66 that corresponds to the surface of the organic EL element 40. The desiccating agent 68 may be formed of any material with moisture-absorbing characteristics. Examples of the material of the desiccating agent 68 are a simple-substance alkali metal such as lithium (Li), sodium (Na) or potassium (K) or an oxide thereof, and an alkali earth metal such as magnesium (Mg), calcium (Ca) or barium (Ba) or an oxide thereof.

The array substrate 100 includes partition walls 70 that separate at least neighboring color pixels RX (R, G, B) in the display area 102. It is preferable that the partition walls 70 be formed so as to separate the pixels. In this example, the partition walls 70 are arranged in a lattice shape along the peripheral edges of the first electrodes 60 so that the opening defined by the partition walls 70, where the first electrode 60 is exposed, may have a circular or polygonal shape. The partition walls 70 are formed of resin materials. For example, the partition wall 70 has a stacked structure comprising a first insulating layer of a lyophilic organic material and a second insulating layer of a lyophobic organic material that is disposed on the first insulating layer.

In the organic EL device 40 with the above-described structure, electrons and holes are injected in the organic active layer 64 sandwiched between the first electrode 60 and second electrode 66. The electron and hole are recombined to form an exciton, and light is produced by photo-emission of a predetermined wavelength which occurs when the exciton is deactivated. In this example, the EL light is emitted from the lower surface side of the array substrate 100, that is, from the first electrode 60 side.

The array substrate 100 includes an effective region 106 that is formed on the major surface of the wiring substrate 120. In this example, it is assumed that the effective region 106 includes at least the display area 102 for displaying an image. Alternatively, the effective region 106 may include the peripheral area 104 including the scan line drive circuit 107 and signal line drive circuit 108.

Figure 3:
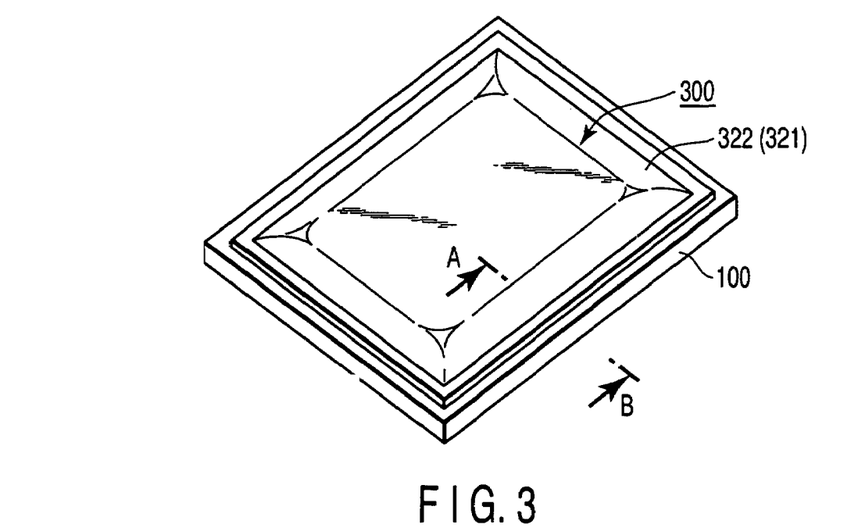
FIG. 3 is a perspective view that schematically shows the external appearance of an array substrate that includes a sealing body.

The sealing body 300, as shown in FIGS. 2 and 3, is disposed to cover at least the effective region 106 of the major surface of the array substrate 100, that is, of the surface of the array substrate 100 where the organic EL element 40 is formed. The sealing body 300 is a stacked structure comprising a plurality of thin films, and the surface thereof is substantially planarized.

As is shown in FIG. 2, a sealing member 200 is attached to the surface of the sealing body 300 by an adhesive that is coated on the entire surface of the sealing body 300. The sealing member 200 is formed of, e.g. a light-transmissive insulating film such as a plastic sheet, or diamond-like carbon.

The sealing body 300 has a stacked structure that comprises at least one buffer layer (second thin film) 311, 312, . . ., and a barrier layer 320, 321, 322, . . ., which has a pattern with a larger area than the buffer layer and covers the buffer layer so as to shield the buffer layer from outside air. It is preferable that the outermost layer of the sealing body 300 (i.e. the layer farthest from the array substrate 100) and the innermost layer of the sealing body 300 (i.e. the layer closest to the array substrate 100) be barrier layers. Thus, the sealing body 300 includes at least two barrier layers (first thin film and third thin film). In the example shown in FIG. 2, the sealing body 300 includes the barrier layer 320 as the innermost layer, and the barrier layer 322 as the outermost layer. It is preferable that each barrier layer cover, at the peripheral part thereof, the entirety of the underlying buffer layer including its side face. In other words, in consideration of the contact between the barrier layers and the sealing performance of the sealing body, it is preferable that the buffer layer be so disposed as to partly cover the barrier layer and that the barrier layers having larger patterns than the buffer layer be stacked at their peripheral parts.

Each buffer layer 311, 312, . . ., is formed of an organic material. For example, each buffer layer 311, 312, . . ., is formed of an acrylic resin material. In addition, each buffer layer 311, 312, . . ., should preferably be formed with a greater thickness than the barrier layer, e.g. with a thickness of about 0.1 to 5 μm. Each buffer layer 311, 312, . . ., has a pattern with at least a size equal to the size of the effective region 106, and preferably a size greater than the size of the effective region 106. Each buffer layer 311, 312, . . ., may be formed by plasma polymerization using a gas material or by spin-coating using a liquid material. For example, as the material of the buffer layer 311, 312, . . ., it is preferable to select a material that can be coated in a liquid state with a relatively low viscosity and can be solidified in such a state as to planarize irregularities on the underlying layer. The buffer layer 311, 312, . . ., that is formed of such a material functions as a planarizing layer that planarizes the surface of the underlying layer.

Each barrier layer 320, 321, 322, . . ., is formed of an inorganic material. For example, each barrier layer 320, 321, 322, . . ., is formed of a metal material such as aluminum or titanium, a metal oxide material such as ITO or IZO, or a ceramic material such as alumina, with a thickness of, e.g. about 500 Å to 3 μm, preferably about 2000 Å. In the case of a back-face emission system in which EL light is extracted from the first electrode 60 side, the material that is used for at least one of the barrier layers 320, 321, 322, . . ., may have light-blocking properties or reflectivity. In the case of a top-face emission system in which EL light is extracted from the second electrode 66 side, the material that is used for the barrier layers 320, 321, 322, . . ., should preferably have light transmissivity. In addition, if the contact between the barrier layers is considered, it is desirable that the barrier layers be formed of the same material.

In the sealing body 300 with the above-described structure, at least one barrier layer is disposed to contact the underlying barrier layer and to cover the underlying barrier layer. For example, as shown in FIG. 4, the sealing body 300 comprises a first barrier layer (a first thin film) 320 that is disposed to cover the effective region 106; a buffer layer (a second thin film) 311 that is disposed on the first barrier layer 320 so as to partly cover the first barrier layer 320 (in this example, first barrier layer 320 is disposed to correspond in position to the effective region 106); and a second barrier layer (a third thin film) 321 that is formed to cover the buffer layer 311 with a pattern larger than the first barrier layer 320.

Figure 4:
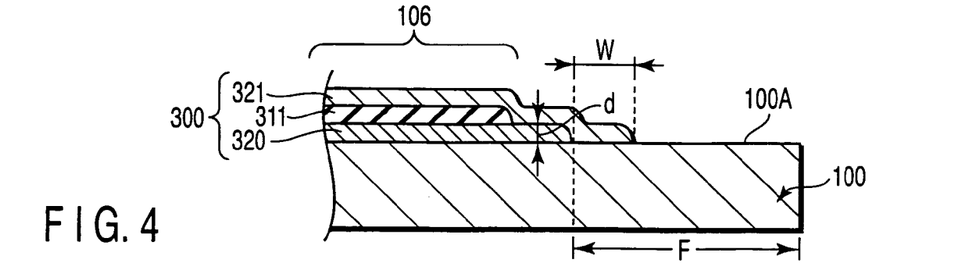
FIG. 4 schematically shows an example of the cross-sectional structure of the sealing body of the array substrate, taken along line A-B in FIG. 3.

In the example shown in FIG. 4, the second barrier layer 321 is disposed to contact a peripheral part of the underlying first barrier layer 320 and to cover the first barrier layer 320. In this case, the second barrier layer 321 is put in close contact with a major surface 100A of the array substrate 100 in a frame-like shape along the outer periphery of the first barrier layer 320. Thus, the entirety of the buffer layer 311 and first barrier layer 320, which includes their side surfaces, is completely covered with the second barrier layer 321 that has a larger pattern than the formation area of the buffer layer 311 and first barrier layer 320.

Thereby, it is possible to shield the buffer layer 311 from outside air, and to prevent moisture or oxygen from infiltrating into the organic EL element via the buffer layer 311. In addition, it is possible to shield from outside air an interface between the major surface 100A of the array substrate 100 including the effective region 106 and the first barrier layer 320, an interface between the first barrier layer 320 and the buffer layer 311, an interface between the buffer layer 311 and the second barrier layer 321, and an interface between the first barrier layer 320 and the second barrier layer 321. It is thus possible to prevent moisture or oxygen from entering the organic EL element via these interfaces.

Hence, the performance of the coverage by the sealing body 300 can be enhanced, and degradation in the organic EL element 40 can be suppressed. Therefore, a good display performance can be maintained for a long time.

In the example shown in FIG. 4, the sealing body 300 includes the single buffer layer 311, but it may include two or more buffer layers. In such a case, too, at least one barrier layer is provided so as to cover the underlying barrier layer.

Figure 5:
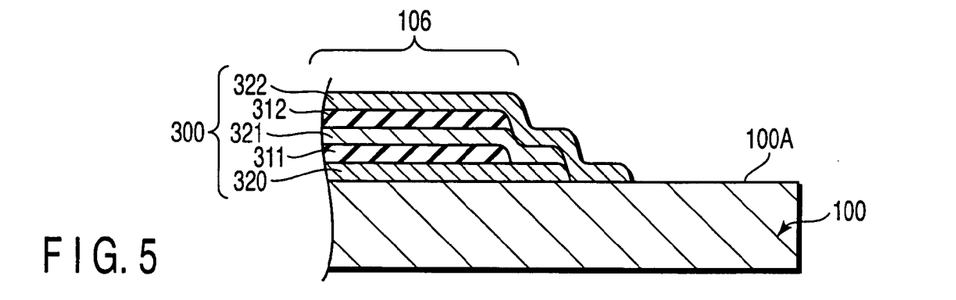
FIG. 5 schematically shows another example of the cross-sectional structure of the sealing body of the array substrate, taken along line A-B in FIG. 3.

Specifically, as shown in FIG. 5, the sealing body 300 may comprise a first barrier layer (a first thin film) 320 that is disposed to cover the effective region 106; a first buffer layer (a second thin film) 311 that is disposed on the first barrier layer 320 so as to partly cover the first barrier layer 320 (in this example, first barrier layer 320 is disposed to correspond in position to the effective region 106); a second barrier layer 321 that has a pattern substantially equal to the pattern of the first barrier layer 320, contacts a peripheral part of the first barrier layer 320, and covers the first buffer layer 311; a second buffer layer 312 that is disposed on the second barrier layer 321 so as to partly cover the second barrier layer 321; and a third barrier layer (a third thin film) 322 that has a pattern larger than the pattern of each of the first barrier layer 320 and second barrier layer 321, contacts peripheral parts of the first barrier layer 320 and second barrier layer 321, and covers the second buffer layer 312, first barrier layer 320 and second barrier layer 321.

In the example shown in FIG. 5, the third barrier layer 322 is disposed to contact the underlying first barrier layer 320 and second barrier layer 321 and to cover the first barrier layer 320 and second barrier layer 321. In this case, the third barrier layer 322 is put in close contact with the major surface 100A of the array substrate 100 in a frame-like shape along the outer peripheries of the first barrier layer 320 and second barrier layer 321. Thus, the entirety of the second buffer layer 312, first barrier layer 320 and second barrier layer 321, which includes their side surfaces, is completely covered with the third barrier layer 322 that has a larger pattern than the formation area of the second buffer layer 312, first barrier layer 320 and second barrier layer 321.

Thereby, it is possible to shield the first buffer layer 311 and second buffer layer 312 from outside air, and to prevent moisture or oxygen from infiltrating into the organic EL element via the first buffer layer 311 and second buffer layer 312.

In addition, it is possible to shield from outside air an interface between the major surface 100A of the array substrate 100 including the effective region 106 and the first barrier layer 320, an interface between the first barrier layer 320 and the buffer layer 311, an interface between the first buffer layer 311 and the second barrier layer 321, an interface between the second barrier layer 321 and second buffer layer 312, an interface between the second buffer layer 312 and third barrier layer 322, and an interface between the first barrier layer 320 and the second barrier layer 321. It is thus possible to prevent moisture or oxygen from entering the organic EL element via these interfaces.

Hence, the performance of the coverage by the sealing body 300 can be enhanced, and degradation in the organic EL element 40 can be suppressed. Therefore, a good display performance can be maintained for a long time.

In the example shown in FIG. 5, the surface layer (uppermost layer) of the sealing body 300 covers the entirety of the underlying buffer layers and barrier layers. In a case where the number of layers between the uppermost barrier layer and the major surface 100A of the array substrate 100 is large, the peripheral part of the sealing body 300 may have a steep oblique surface, and the performance of coverage may deteriorate. In the case of the sealing body 300 including two or more buffer layers, it is preferable that a barrier layer that is provided under the surface layer be configured to cover an underlying barrier layer.

Figure 6:
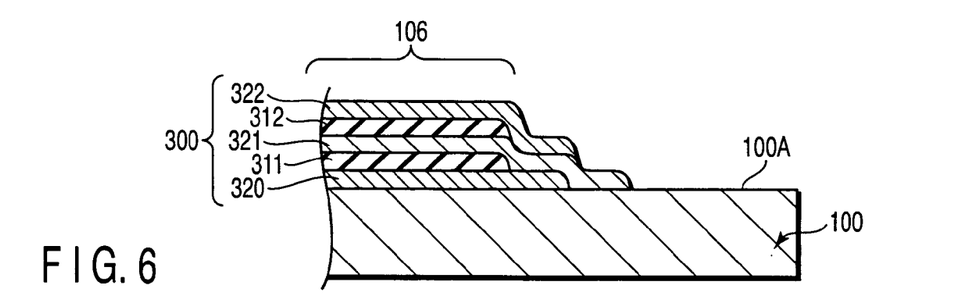
FIG. 6 schematically shows still another example of the cross-sectional structure of the sealing body of the array substrate, taken along line A-B in FIG. 3.

For example, as shown in FIG. 6, the sealing body 300 may comprise a first barrier layer (a first thin film) 320 that is disposed to cover the effective region 106; a first buffer layer (a second thin film) 311 that is disposed on the first barrier layer 320 so as to partly cover the first barrier layer 320 (in this example, first barrier layer 320 is disposed to correspond in position to the effective region 106); a second barrier layer (a third thin film) 321 that has a pattern larger than the pattern of the first barrier layer 320, contacts a peripheral part of the first barrier layer 320, and covers the first buffer layer 311 and first barrier layer 320; a second buffer layer 312 that is disposed on the second barrier layer 321 so as to partly cover the second barrier layer 321; and a third barrier layer 322 that has a pattern smaller than the pattern of the second barrier layer 321, contacts a peripheral part of the second barrier layer 321, and covers the second buffer layer 312.

In the example shown in FIG. 6, the second barrier layer 321 is put in close contact with the major surface 100A of the array substrate 100 in a frame-like shape along the outer periphery of the underlying first barrier layer 320. Thus, the entirety of the first buffer layer 311 and first barrier layer 320, which includes their side surfaces, is completely covered with the second barrier layer 321 that has a larger pattern than the formation area of the first buffer layer 311 and first barrier layer 320.

Thereby, it is possible to shield the first buffer layer 311 from outside air, and to prevent moisture or oxygen from infiltrating into the organic EL element via the first buffer layer 311. The entirety of the second buffer layer 312 including its side surface is completely covered with the third barrier layer 322. It is thus possible to shield the second buffer layer 312 from outside air, and to prevent moisture or oxygen from infiltrating into the organic EL element via the second buffer layer 312.

In addition, it is possible to shield from outside air an interface between the major surface 100A of the array substrate 100 including the effective region 106 and the first barrier layer 320, an interface between the first barrier layer 320 and the first buffer layer 311, and an interface between the first barrier layer 320 and second barrier layer 321. It is thus possible to prevent moisture or oxygen from entering the organic EL element via these interfaces. Besides, the interface between the second barrier layer 321 and second buffer layer 312 and the interface between the second buffer layer 312 and third barrier layer 322 are covered with the third barrier layer 322. It is thus possible to prevent moisture or oxygen from entering the organic EL element via these interfaces.

Furthermore, the barrier layer 321, which is provided under the uppermost barrier layer 322, is configured to cover the underlying barrier layer 320. Therefore, the peripheral part of the sealing body 300 has a gentle oblique surface, and degradation in coverage performance can be prevented.

Hence, the performance of the coverage by the sealing body 300 can be enhanced, and degradation in the organic EL element 40 can be suppressed. Therefore, a good display performance can be maintained for a long time.

Figure 7:
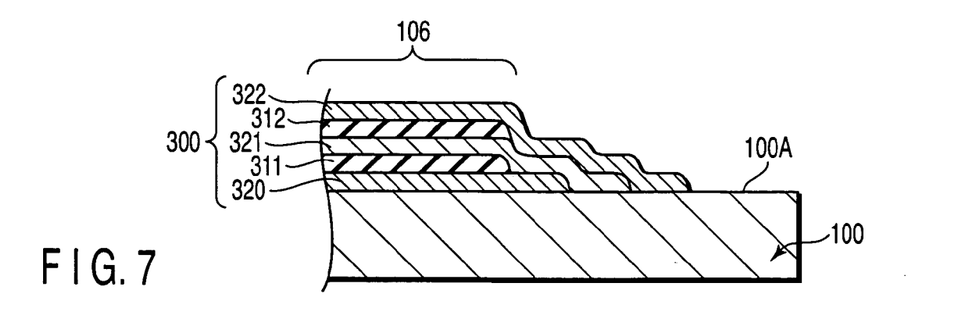
FIG. 7 schematically shows still another example of the cross-sectional structure of the sealing body of the array substrate, taken along line A-B in FIG. 3.

As is shown in FIG. 7, the sealing body 300 may comprise a first barrier layer (a first thin film) 320 that is disposed to cover the effective region 106; a first buffer layer (a second thin film) 311 that is disposed on the first barrier layer 320 so as to partly cover the first barrier layer 320 (in this example, first barrier layer 320 is disposed to correspond in position to the effective region 106); a second barrier layer (a third thin film) 321 that has a pattern larger than the pattern of the first barrier layer 320, contacts a peripheral part of the first barrier layer 320, and covers the first buffer layer 311 and first barrier layer 320; a second buffer layer 312 that is disposed on the second barrier layer 321 so as to partly cover the second barrier layer 321; and a third barrier layer 322 that has a pattern larger than the pattern of the second barrier layer 321, contacts a peripheral part of the second barrier layer 321, and covers the second buffer layer 312 and second barrier layer 321.

In the example shown in FIG. 7, the second barrier layer 321 is put in close contact with the major surface 100A of the array substrate 100 in a frame-like shape along the outer periphery of the underlying first barrier layer 320. Thus, the entirety of the first buffer layer 311 and first barrier layer 320, which includes their side surfaces, is completely covered with the second barrier layer 321 that has a larger pattern than the formation area of the first buffer layer 311 and first barrier layer 320.

Thereby, it is possible to shield the first buffer layer 311 from outside air, and to prevent moisture or oxygen from infiltrating into the organic EL element via the first buffer layer 311. In addition, it is possible to shield from outside air an interface between the major surface 100A of the array substrate 100 including the effective region 106 and the first barrier layer 320, an interface between the first barrier layer 320 and the first buffer layer 311, and an interface between the first barrier layer 320 and second barrier layer 321. It is thus possible to prevent moisture or oxygen from entering the organic EL element via these interfaces.

The third barrier layer 322 is put in close contact with the major surface 100A of the array substrate 100 in a frame-like shape along the outer periphery of the second barrier layer 321. Thus, the entirety of the second buffer layer 312 and second barrier layer 321, which includes their side surfaces, is completely covered with the third barrier layer 322 that has a larger pattern than the formation area of the second buffer layer 312 and second barrier layer 321.

Thereby, it is possible to shield the second buffer layer 312 from outside air, and to prevent moisture or oxygen from infiltrating into the organic EL element via the second buffer layer 312. In addition, it is possible to shield from outside air an interface between the major surface 100A of the array substrate 100 including the effective region 106 and the second barrier layer 321, an interface between the second barrier layer 321 and the second buffer layer 312, and an interface between the second barrier layer 321 and third barrier layer 322. It is thus possible to prevent moisture or oxygen from entering the organic EL element via these interfaces.

Furthermore, the barrier layer 321, which is provided under the uppermost barrier layer 322, is configured to cover the underlying barrier layer 320. Additionally, the uppermost barrier layer 322 is configured to cover the underlying barrier layers 320 and 321. Thus, the performance of the coverage by the sealing body 300 can be enhanced, and degradation in the organic EL element 40 can be suppressed. Therefore, a good display performance can be maintained for a long time.

In any of the examples shown in FIG. 4 to FIG. 7, the buffer layer has a size substantially equal to (or slightly larger than) the effective region. The invention is not limited to this structure. The respective layers may have different sizes. It should suffice if the buffer layer with a smallest size is substantially equal in size to the effective region.

Preferably, as shown in FIG. 4, a width W, by which the upper barrier layer that covers the underlying barrier layer is in contact with the major surface 100A of the array substrate 100, should be equal to or greater than a film thickness d of the underlying barrier layer. Normally, the barrier layer is formed with a thickness on the order of 0.1 μm. It is thus desirable that the width W of the frame-like portion of the upper barrier layer, which contacts the major surface 100A of the array substrate 100, be 0.1 μm or more. Thereby, the upper barrier layer can sufficiently be put in close contact with the major surface 100A of the array substrate 100. Moreover, the width of the interface between the major surface 100A and upper barrier layer can sufficiently be secured. For example, even if moisture or oxygen infiltrates through the interface between the major surface 100A and upper barrier layer, the length of the route to the organic EL element is large, and the infiltration into the organic EL element can be suppressed and a longer lifetime can effectively be attained. The upper limit value of width W is a width F of the frame-like portion of the major surface 100A, as measured from the end of the underlying barrier layer.

Next, a method of manufacturing an organic EL display device is described. For simple description, the method of fabricating the organic EL display device including the sealing body with the structure shown in FIG. 4 is described.

Figure 8A:
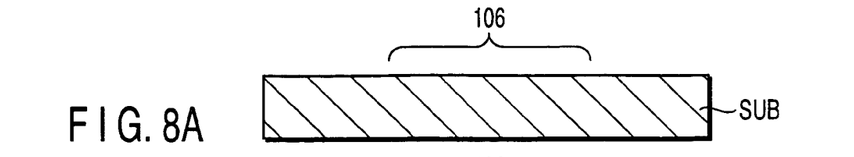
FIG. 8A to FIG. 8D are schematic cross-sectional views, illustrating a process of fabricating an organic EL display device.

To start with, as shown in FIG. 8A, a substrate SUB, on a major surface of which an effective region 106 is formed, is prepared. It is assumed that the effective region 106 includes a plurality of pixels PX each comprising pixel switches 10, driving transistors 20, storage capacitance elements 30, scan line drive circuit 107, signal line drive circuit 108, various lines such as signal lines Xn, scan lines Ym and power supply lines P, and organic EL elements 40, which are fabricated by repeating formation and patterning of metal films and insulating films.

Then, a sealing body 300 is disposed so as to cover at least the effective region 106 on the major surface of the substrate SUB.

Figure 9:
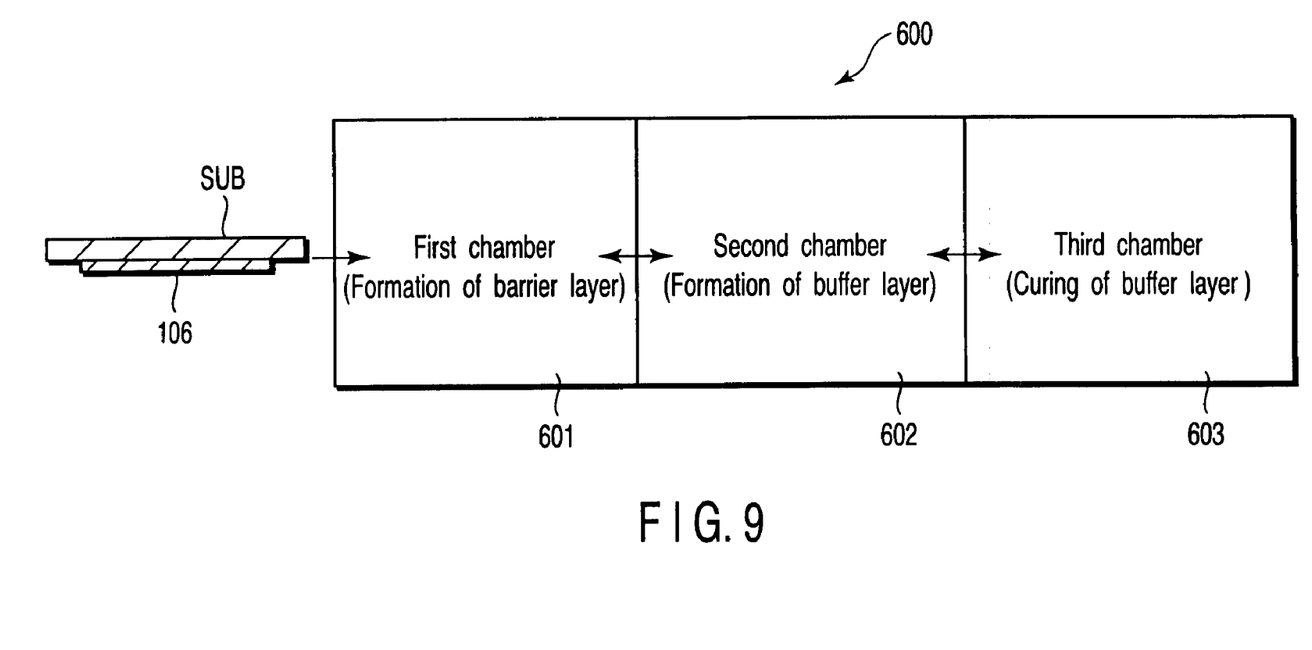
FIG. 9 schematically shows the structure of a manufacturing apparatus for forming a sealing body.

The sealing body 300 is formed by a manufacturing apparatus 600, for example, as shown in FIG. 9. The manufacturing apparatus 600 comprises a first chamber 601 for forming a barrier layer, a second chamber 602 for forming a buffer layer of a resin material, and a third chamber 603 for curing the formed layer of the resin material.

In the first chamber 601, a metal material serving as a barrier layer is evaporated via a barrier layer formation mask having an opening with a predetermined shape. The barrier layer formation mask in this example is disposed within the first chamber 601 between the material source for formation of the barrier layer and the major surface of the substrate SUB on which the effective region 106 is formed. The barrier layer formation mask is aligned in a predetermined positional relationship, relative to the substrate SUB that is introduced with its effective region 106 being directed toward the evaporation source. The barrier layer formation mask may be configured to be movable in a direction normal to the substrate SUB in the state in which the barrier layer formation mask is parallel to the major surface of the substrate SUB.

In the second chamber 602, a liquid monomer of a resin material, which serves as a buffer layer, is evaporated and a film of the monomer is formed by evaporation through a buffer layer formation mask having an opening with a predetermined shape. The buffer layer formation mask in this example is disposed within the second chamber 602 between the material source for formation of the buffer layer and the major surface of the substrate SUB on which the effective region 106 is formed. The buffer layer formation mask is aligned in a predetermined positional relationship, relative to the substrate SUB that is introduced with its effective region 106 being directed toward the evaporation source.

In the third chamber 603, the monomer of the formed film is polymerized and thus the resin material is cured. In the case where a photosensitive resin material (e.g. ultraviolet-curing resin material) is used as the monomer, the third chamber 603 is equipped with a light source of a predetermined wavelength (e.g. ultraviolet wavelength). In the third chamber 603, the monomer of the formed film is exposed with a predetermined exposure amount and is polymerized. Thereby, a buffer layer is formed.

On the other hand, in the case where an electron-beam-curing resin material is used as the monomer, the third chamber 603 is equipped with an electron beam source. In the third chamber 603, the monomer of the formed film is irradiated with an electron beam and polymerized. Thus, a buffer layer is formed.

In this example, the second chamber 602 for film formation and the third chamber 603 for curing are prepared in order to form the buffer layer. Alternatively, the second chamber 602 may be equipped with a light source of a predetermined wavelength or an electron beam source, and the film-formation step and curing step may be executed at a time in the second chamber 602. In addition, the curing step (third chamber) may be dispensed with by evaporating a resin material that is polymerized in gas phase in the second chamber 602.

Figure 8B:
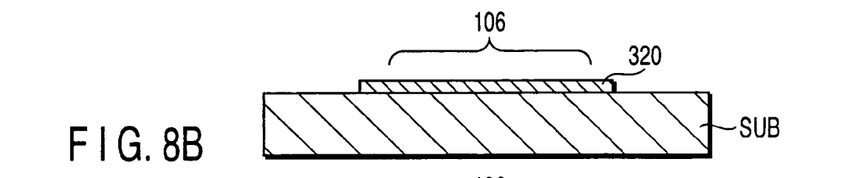

As is shown in FIG. 8B, a first barrier layer 320 (a first thin film) for shielding the effective region 106 from outside air is formed on the major surface of the substrate SUB. Specifically, the substrate SUB with the effective region 106 is introduced into the first chamber 601. In the first chamber 601, the first barrier layer 320 is formed by evaporating a metallic material via a barrier layer formation mask BM. In this case, the first barrier layer 320 is formed on the major surface of the substrate SUB over a large range that includes the effective region 106 and is larger than the effective region 106.

Figure 8C:
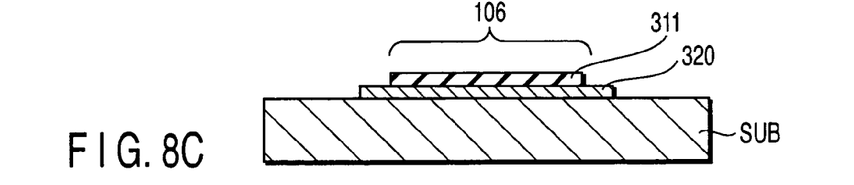

Subsequently, as shown in FIG. 8C, a buffer layer (a second thin film) 311 with a pattern that is larger than at least the effective region 106 is formed on the first barrier layer 320 so as to correspond in position to the effective region 106. In other words, the substrate SUB is introduced in the second chamber 602. A liquid monomer of, e.g. an ultraviolet-curing resin material is evaporated as resin material, and a film of monomer is formed by evaporation on the major surface of the substrate SUB via a buffer layer formation mask. In this case, the film of the monomer is formed over a range that is smaller than the first barrier layer 320, which is located just under the film of the monomer, and includes the effective region 106 and is greater than the effective region 106.

The substrate SUB is then introduced in the third chamber 603. In the third chamber 603, the monomer film formed on the major surface of the substrate SUB is irradiated with ultraviolet-wavelength light with a predetermined exposure amount. Thereby, the monomer is polymerized and cured, and a buffer layer 311 is formed.

Figure 8D:
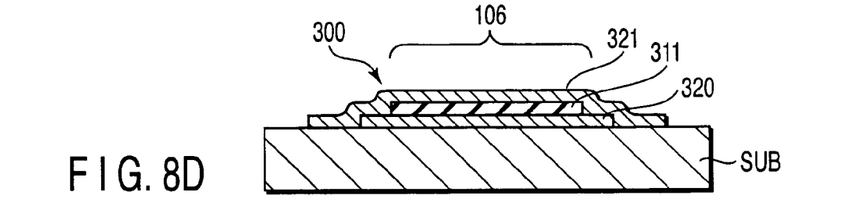

Then, as shown in FIG. 8D, in the first chamber 601, like the first barrier layer 320, a second barrier layer (a third thin film) 321 for shielding the buffer layer 311 and first barrier layer 320 from outside air is formed on the major surface of the substrate SUB. The second barrier layer 321 is formed over a range that is larger than the buffer layer 311 and first barrier layer 320, which are located just under the second barrier layer 321. Through these steps, the sealing body 300 with the structure as shown in FIG. 4 is formed.

Over the surface of the sealing body 300, that is, over the entire surface of the second barrier layer 321, an adhesive is coated and a sealing member 200 is attached. In a case where a plurality of array sections are formed on the mother board, the mother board is diced into individual array sections with unit sizes. Where necessary, a polarizer plate may be attached to the surface from which EL light is extracted.

For example, in the step of forming the second barrier layer 321 in the above-described fabrication process, the second barrier layer 321, which is larger in size than the first barrier layer 320 can be formed by using another barrier layer formation mask that has an opening with a larger size than the barrier layer formation mask used in the step of forming the first barrier layer 320.

Alternatively, in the step of forming the second barrier layer 321, for example, the same barrier layer formation mask as has been used in the step of forming the first barrier layer 320 may be used, and the distance between the substrate SUB and the barrier layer formation mask may be controlled (e.g. the distance between the major surface of the substrate and the barrier layer formation mask is made greater in the step of forming the second barrier layer 321 than in the step of forming the first barrier layer 320). Thereby, the second barrier layer 321, which has a larger size than the first barrier layer 320, may be formed.

Figure 10:
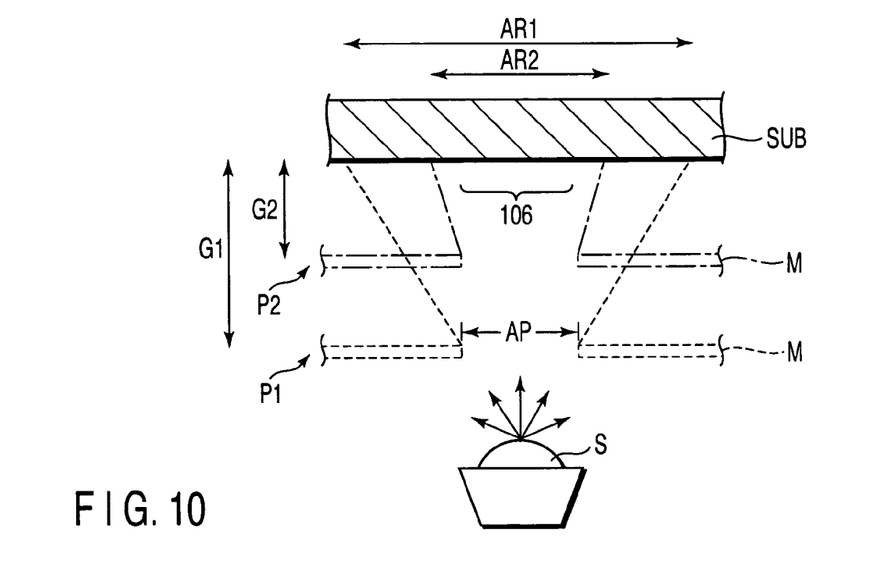
FIG. 10 schematically shows the structure of a first chamber in the manufacturing apparatus shown in FIG. 9.

Specifically, as shown in FIG. 10, in the first chamber 601, if the distance between the substrate SUB and the barrier layer formation mask M is increased, a pattern that is formed by evaporation on the major surface of the substrate SUB is made wider than an opening AP in the barrier layer formation mask M. This phenomenon may advantageously be used.

For example, when the barrier layer formation mask M is set at a first position P1 that is relatively far from the major surface of the substrate SUB, a relatively large first distance G1 is provided between the substrate SUB and the barrier layer formation mask M. By situating the barrier layer formation mask M at the first position P1, the reaching of metallic material flying from a material source S to the major surface of the substrate SUB is restricted and the metallic material that passes through the opening AP reaches a first area AR1 on the major surface of the substrate SUB. In short, the metallic material is deposited by evaporation on the first area AR1.

On the other hand, when the barrier layer formation mask M is set at a second position P2 that is relatively close to the major surface of the substrate SUB, a relatively small second distance G2 is provided between the substrate SUB and the barrier layer formation mask M. By situating the barrier layer formation mask M at the second position P2, the reaching of metallic material flying from the material source S to the major surface of the substrate SUB is further restricted and the metallic material that passes through the opening AP reaches a second area AR2 on the major surface of the substrate SUB. In short, the metallic material is deposited by evaporation on the second area AR2 that is smaller than the first area AR1.

In brief, in the case where the respective barrier layers of the sealing body 300 are to be formed by evaporating the metallic material via the mask that has the opening AP of the same pattern, it becomes possible to form barrier layers having patterns with different sizes by varying the distance between the major surface of the substrate SUB and the mask M. Thus, there is no need to prepare a plurality of masks in order to form a plurality of barrier layers with patterns of different sizes, and the manufacturing cost can be reduced.

According to the organic EL display device 1 that is manufactured by the above-described fabrication process, the adverse effect of the underlying layer can be reduced and the organic EL element 40 that is formed on the effective region 106 can surely be covered. Even if a microscopic gap is present in any one of the buffer layers or barrier layers, the stacking of the plural layers increases the length of the route to the organic EL element 40, and a longer lifetime can effectively be attained. Therefore, the organic EL element 40 can be shielded from outside air, and a satisfactory performance can be maintained for a long time. In addition, when the sealing member 200 is attached on the sealing body 300 by an adhesive or a polarizer plate is attached on the sealing member 200 by an adhesive, infiltration of impurities contained in the adhesive into the organic EL element 40 can be prevented, and degradation in performance in the organic EL element 40 can be prevented.

As has been described above, this embodiment provides a display device comprising a substantially rectangular effective region, which is formed on the major surface of the substrate and includes a plurality of pixels for displaying an image, and a sealing body that is disposed to cover at least the effective region on the major surface of the substrate. In the display device, the sealing body has such a structure that a buffer layer and at least two barrier layers, each of which has a larger pattern than the buffer layer and covers the buffer layer, are stacked. Moreover, at least one barrier layer is disposed to contact a peripheral part of the underlying barrier layer and to cover the underlying barrier layer.

Thus, the display element that is formed on the effective region can surely be covered, and the interfaces between the layers of the sealing body can surely be covered. Therefore, high shielding properties against external impurities or outside air can be secured, and a good display performance can be maintained for a long time.

The present invention is not limited to the above-described embodiments. In practice, the structural elements can be modified without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined.

In the above-described embodiment, descriptions have been given, by way of example, of the case (FIG. 4) in which the sealing body comprises one buffer layer and two barrier layers and the cases (FIGS. 5 to 7) in which the sealing body comprises two buffer layers and three barrier layers. However, the combinations of the layers are not limited to these examples. In a case where the sealing body is formed by stacking ten or more thin films, the number of fabrication steps becomes too large and the productivity would deteriorate. Thus, the number of thin films to be stacked is set to be two or more, and less than 10, and preferably between three and five.

What is claimed is:

1. A display device comprising:
a first substrate including, on a major surface thereof, a display area including a plurality of pixels for displaying an image, each of the plurality of pixels having a first electrode, a second electrode, and an optical active layer, the first electrode is located above the first substrate, the second electrode is located above and facing the first electrode, and the optical active layer is disposed between the first electrode and the second electrode; and
a stacked layer body located above the major surface of the first substrate and having a first thin film, a second thin film, and a third thin film, the first thin film is configured to cover the plurality of pixels, the second thin film is located above the first thin film and includes an upper surface and a side surface, and the third thin film is located above the upper surface of the second thin film and is configured to cover the upper surface and the side surface of the second thin film, and the area of the stacked layer body being smaller than the area of the major surface of the first substrate; and
a second substrate located above the third thin film of the stacked layer body,
wherein the first thin film and the third thin film are formed of an inorganic material,
the second thin film is formed of an organic material, and
the third thin film contacts a peripheral part of the first thin film and covers the first thin film.

2. The display device according to claim 1, wherein the first thin film and the third thin film are formed of the same material.

3. The display device according to claim 1, wherein the second thin film is formed to have a greater thickness than each of the first thin film and the third thin film.

4. The display device according to claim 1, wherein the third thin film extends on the major surface of the substrate in a frame-like shape.

5. The display device according to claim 4, wherein a width, by which the third thin film extends on the major surface of the substrate, is equal to or greater than a thickness of the first thin film.

6. The display device according to claim 1, wherein the stacked layer body further includes a fourth thin film and a fifth thin film, the fourth thin film is located above the third thin film and having an upper surface and a side surface, and the fifth thin film is located above the upper surface of the fourth thin film and is configured to cover the upper surface and the side surface of the fourth thin film.

7. The display device according to claim 6, wherein the fifth thin film extends on the major surface of the substrate in a frame-like shape.

8. The display device according to claim 1, wherein the second electrode is disposed commonly to the pixels.

* * * * *